(12) United States Patent
Shimoda (10) Patent No.: US 6,518,808 B2
(45) Date of Patent: Feb. 11, 2003

(54) SLEW RATE ADJUSTING CIRCUIT AND SEMICONDUCTOR DEVICE

(75) Inventor: Masaki Shimoda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/871,738

(22) Filed: Jun. 4, 2001

(65) Prior Publication Data

US 2002/0060592 A1 May 23, 2002

(30) Foreign Application Priority Data

Nov. 20, 2000 (JP) ........................................ 2000-352271

(51) Int. Cl.⁷ ................................................ H03B 1/00
(52) U.S. Cl. .................... 327/172; 327/170; 327/108
(58) Field of Search ................................. 327/170, 175, 327/261, 270, 281, 288, 108, 172; 326/87, 30, 83, 86

(56) References Cited

U.S. PATENT DOCUMENTS 5,959,481 A * 9/1999 Donnelly et al. ............ 327/170
6,034,548 A * 3/2000 Churcher et al. ............. 326/86
6,163,178 A * 12/2000 Stark et al. .................. 327/108

* cited by examiner

*Primary Examiner*—Dinh T. Le
(74) *Attorney, Agent, or Firm*—McDermott, Will & Emery (57) ABSTRACT

In a slew rate adjusting circuit for producing a timing signal determining an output slew rate, a delay circuit for producing an output timing signal is formed of delay circuits with a variable number of delay stages, and the delay time of the output timing signal is adjusted in a step of a delay time of the delay stage in accordance with slew rate adjusting data. A large adjustment margin can be ensured for the output slew rate determining the changing rate of the output data.

15 Claims, 10 Drawing Sheets

SLEW RATE ADJUSTING CIRCUIT AND SEMICONDUCTOR DEVICE

BACKGROUND OF THE INVENTION

1. Field of the Invention

The present invention relates to a semiconductor device, and particularly to a structure of a circuit for adjusting an output slew rate of a data output circuit. More specifically, the present invention relates to a structure for adjusting an output slew rate of a data output circuit in a clock synchronous semiconductor memory device, which in turn outputs data in synchronization with a clock signal.

2. Description of the Background Arts

In recent years, a clock synchronous semiconductor memory device, which transfers data in synchronization with a clock signal such as a system clock, has been used for transferring data fast. The clock synchronous semiconductor memory device takes in an external control signal, an address signal and write data in synchronization with a clock signal, and transfers output data in synchronization with the clock signal. Therefore, the control signal and the address signal can be taken in with only a skew of the external signals with respect to the clock signal considered, to start the internal operation at a faster timing.

Further, the data is transferred in synchronization with the clock signal. Therefore, the data transfer rate is equivalently equal to the rate of clock signal so that the data can be transferred at a high rate.

Figure 14:
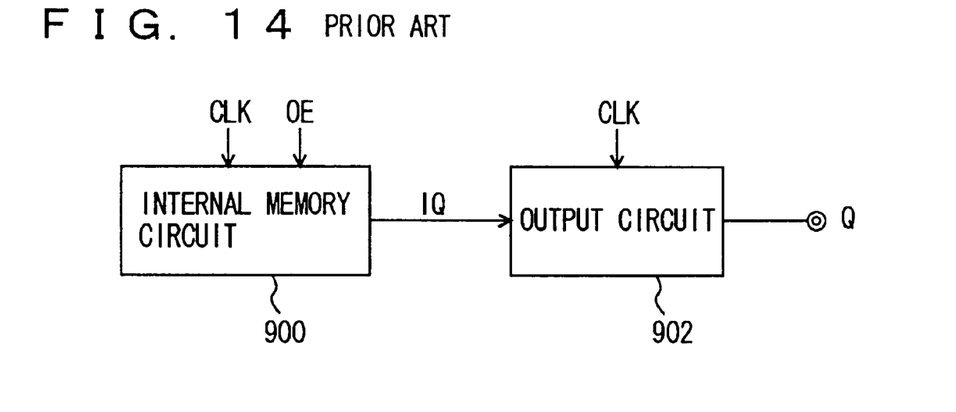
FIG. 14 schematically shows a structure of a conventional output portion of the semiconductor memory device.

FIG. 14 schematically shows a structure of a clock synchronous semiconductor memory device in the prior art. In FIG. 14, the semiconductor memory device includes: an internal memory circuitry 900 which has a plurality of memory cells, and reads out data of a selected memory cell in accordance with a clock signal CLK and an output enable signal OE for producing internal read data IQ; and an output circuit 902 which externally transfers internal read data in synchronization with clock signal CLK for producing output data Q.

Internal memory circuitry 900 includes a memory cell array, a memory row select circuit, a memory cell select circuit, an internal data write circuit, an internal data read circuit, an address buffer circuit and others.

Figure 15:
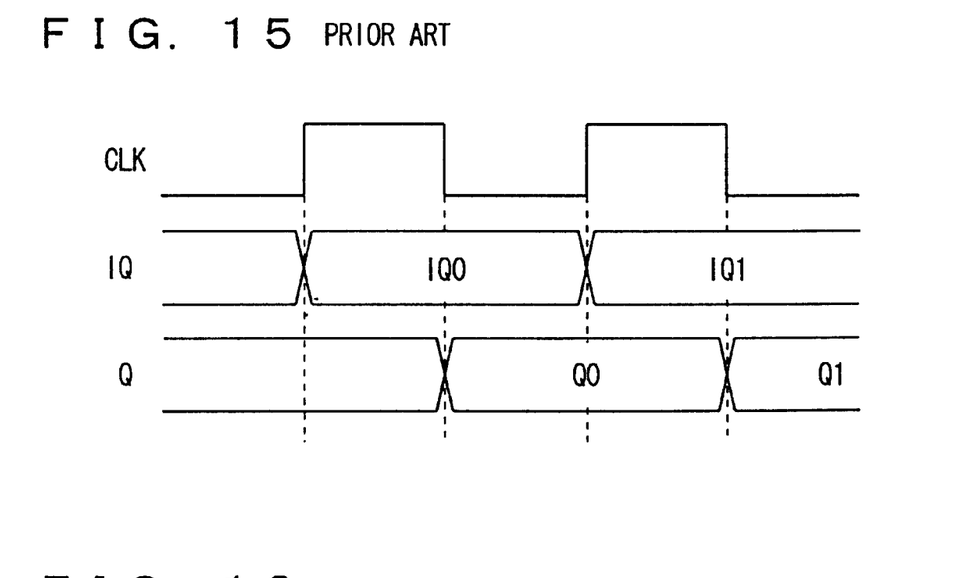
FIG. 15 is a timing chart representing an operation of an output circuit showing FIG. 14.

FIG. 15 is a timing chart representing a data output operation of the semiconductor memory device shown in FIG. 14. As shown in FIG. 15, internal read data IQ is produced from internal memory circuitry 900 in accordance with output enable signal OE and clock signal CLK. FIG. 15 shows internal read data IQ0 and IQ1 changing in synchronization with rising of clock signal CLK.

Output circuit 902 transfers internal read data IQ read from internal memory circuit 900 in synchronization with the falling of clock signal CLK. Output data Q, which is externally read out, changes in synchronization with falling of clock signal CLK. An external logic circuit such as a processor samples the received data in synchronization with the rising of dock signal CLK. The dock signal CLK is a clock signal synchronized with, e.g., an external system clock.

In FIG. 15, output circuit 92 is shown producing output data Q in synchronization with the falling of clock signal CLK. However, output circuit 902 may produce output data Q in synchronization with both the rising and falling edges of clock signal CLK. Further, output circuit 902 may output data Q in synchronization with the rising of clock signal CLK (internal read data IQ is transferred in synchronization with the falling of clock signal CLK).

As described above, the output data is transferred in synchronization with clock signal CLK, and a logic such as an external processor can accurately sample the data by sampling the data in synchronization with clock signal CLK, so that a memory system capable of fast data transfer can be implemented.

In the structure of the synchronous semiconductor memory device, which transfers output data Q in synchronization with clock signal CLK, output circuit 902 is required to drive the output node fast if clock signal CLK is a fast clock signal.

Figure 16:
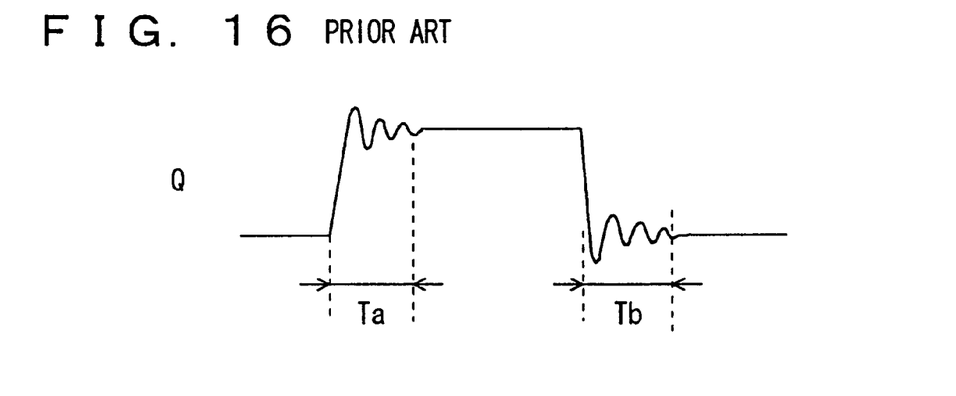
FIG. 16 schematically shows ringing in the conventional output circuit.

When a semiconductor memory device is housed in a package, a pad and a bonding wire are usually connected to an output node, and a large inductance component is present at the output node. Therefore, as shown in FIG. 16, when the output node is driven fast, ringing may occur. If a ringing is caused and the ringing following an overshoot at the rising of output data Q has a large amplitude, an error may occur in determination of H- and L-levels of the data. Likewise, the ringing following undershoot at the falling of data Q may cause a similar error in determination of H- and L-levels of data Q. During continuation of the above ringing, or for time periods Ta and Th, the determination of the logical level of data cannot be performed, and fast data reading cannot be performed. For preventing the above problem related to the ringing, a way of driving the output node in multiple stages has been employed to suppress the ringing conventionally, as described below.

Figure 17:
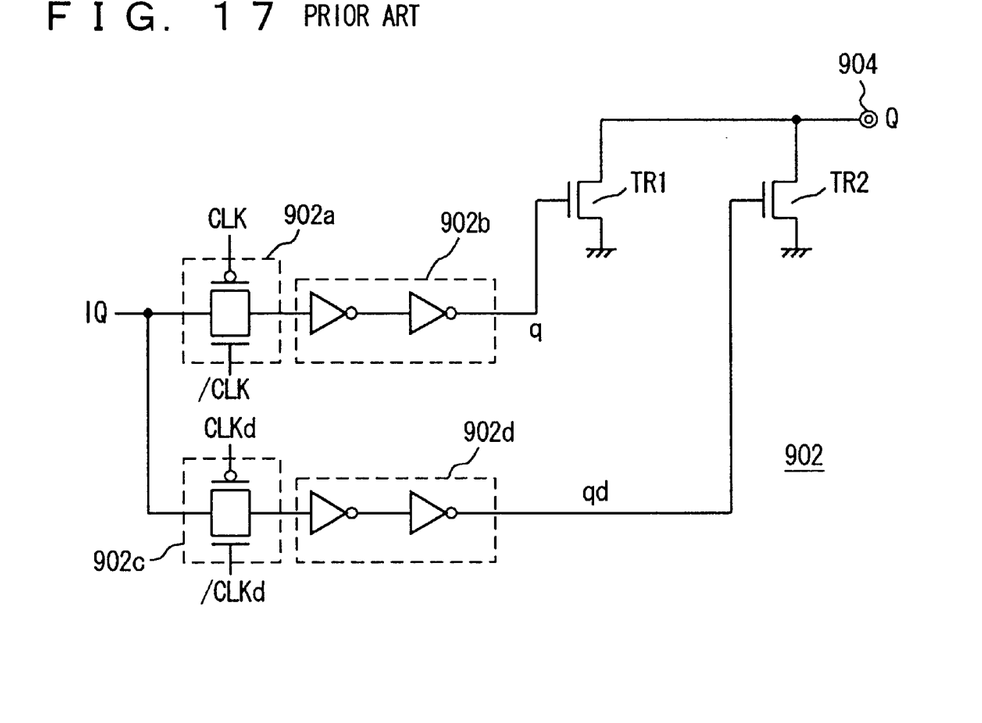
FIG. 17 shows, by way of example, a structure of the output circuit shown in FIG. 14.

FIG. 17 shows, by way of example, a structure of output circuit 902 shown in FIG. 14. In FIG. 17, output circuit 902 includes: a transmission gate 902a which transmits internal read data IQ in accordance with complementary clock signals CLK and /CLK; a buffer circuit 902b which buffers the output signal of transmission gate 902a to produce a drive signal (internal data read signal) q; an N-channel MOS transistor TR1 which discharges output node 904 to the ground voltage level in accordance with drive signal q received from buffer circuit 902b; a transmission gate 902c which passes internal read data IQ in accordance with complementary delayed clock signals CLKd and /CLKd; a buffer circuit 902d which buffers the output signal of transmission gate 902c to produce a delayed drive signal qd; and an N-channel MOS transistor TR2 which discharges output node 904 to the ground voltage level in accordance with delayed drive signal gd received from buffer circuit 902d.

Output node 904 is pulled up to an H-level voltage by a pull-up resistance, which is externally provided to an output signal line (output data line), but is not shown. Output circuit 902 drives output node 904 with an open drain structure.

Transmission gates 902a and 902c are rendered conductive in a same phase but in a phase-shifted timing relationship.

Each of buffer circuits 902b and 902d includes cascaded two inverter circuits, and buffers the received signal for producing drive signal q or qd. Delayed clock signal CLKd is produced by delaying clock signal CLK with a slew rate adjusting circuit, which will be described later.

Figure 18:
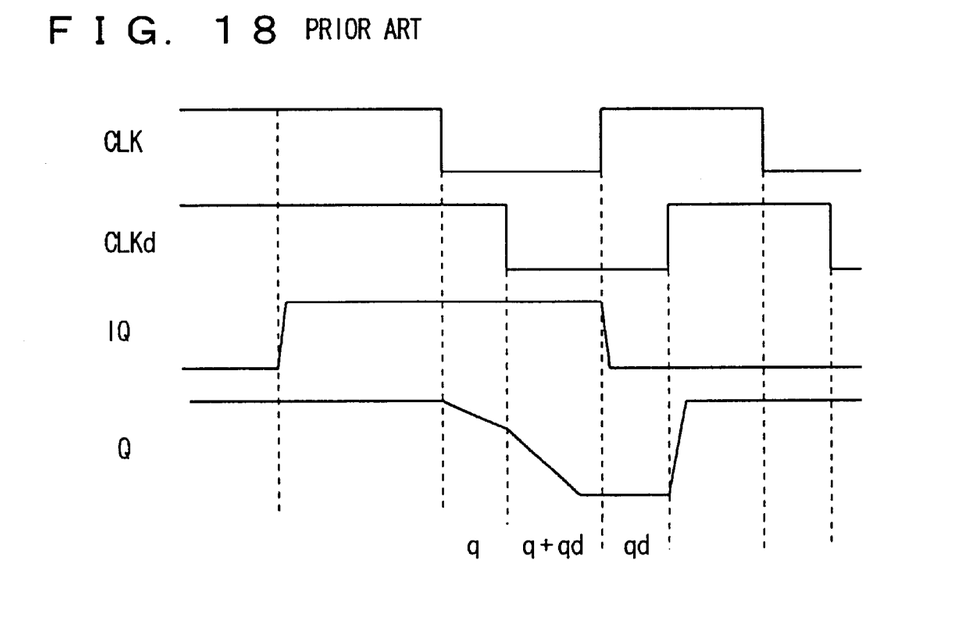
FIG. 18 is a timing chart representing the operation of the output circuit shown in FIG. 17.

FIG. 18 is a signal waveform diagram representing, by way of example, an operation of output circuit 902 shown in FIG. 17. In the example shown in FIG. 18, when output circuit 902 is in the output high-impedance state, external data Q is pulled up to H-level, and internal read data IQ is at L-level in a standby state.

Internal read data IQ changes and rises to H-level in synchronization with the rising of clock signal CLK. Clock signals CLK and CLKd change in accordance with the internal clock signal when output enable signal OE is active.

When internal read data IQ rises from L-level to H-level, both clock signals CLK and CLKD are at H-level, and transmission gates 902a and 902c are both off so that output data Q is held at H-level.

When clock signal CLK falls to L-level, transmission gate 902a is rendered conductive, and drive signal q attains H-level in accordance with internal read data IQ so that MOS transistor TR1 is rendered conductive to discharge output node 904 to the ground voltage level. At this time point, transmission gate 902c is off, and MOS transistor TR2 maintains the off state. When a predetermined time elapses, delayed clock signal CLKd attains L-level, and transmission gate 902c is rendered conductive to set drive signal qd to H-level so that MOS transistor TR2 is turned on. Responsively, output node 904 is driven by two MOS transistors TR1 and TR2.

Thereafter, clock signal CLK rises to H-level, and transmission gate 902a is rendered non-conductive, and MOS transistor TR1 is turned off by a not shown circuit, and MOS transistor TR2 discharges output node 904 to the ground voltage level. When delayed clock signal CLKd attains H-level, transmission gate 902c is rendered non-conductive, and MOS transistor TR2 is likewise turned off by a circuit (not shown), so that output circuit 902 attains the output high-impedance state.

In the output circuit shown in FIG. 17, MOS transistor TR1 discharges output node 904. After elapsing of a predetermined time, MOS transistors TR1 and TR2 discharge output node 904 to the ground voltage level. Therefore, occurrence of the ringing can be suppressed without delaying the output timing (definite timing) of output data Q, because two MOS transistors TR1 and TR2 rapidly discharge output node 904 after the voltage on output node 904 lowers to a voltage level not causing ringing. Thus, the changing rate of output data Q on output node 904, or the output slew rate is adjusted to output the data rapidly and stably.

The speed or rate of driving output node 904 by MOS transistors TR1 and TR2, or the output slew rate depends on manufacturing process conditions, operation voltage conditions and operation temperature conditions. For example, if the size (ratio of channel width to channel length) of output driving MOS transistors TR1 and TR2 increases, MOS transistors TR1 and TR2 have increased current drive capabilities, and rapidly discharge output node 904 to the ground voltage level. In this case, it is necessary to increase the time length for driving the output node by one MOS transistor TR1 for preventing occurrence of the ringing. If the sizes of MOS transistors TR1 and TR2 decrease, the current drive capability for output node 904 decreases, so that both MOS transistors TR1 and TR2 are used for driving output node 904. Thereby, output node 904 is driven fast without causing the ringing.

When the power supply voltage rises, the gate voltages of MOS transistors TR1 and TR2 become high to rise the current drive capabilities of MOS transistors TR1 and TR2. When the operation temperature rises, the current drive capabilities of MOS transistors TR1 and TR2 rise. Therefore, the delay time of delayed clock signal CLKd must be adjusted in accordance with the manufacturing process conditions, operation temperature conditions and operation power supply voltage conditions for adjusting the time period, for which MOS transistors TR1 and TR2 are in a conductive state, in accordance with these conditions.

Figure 19:
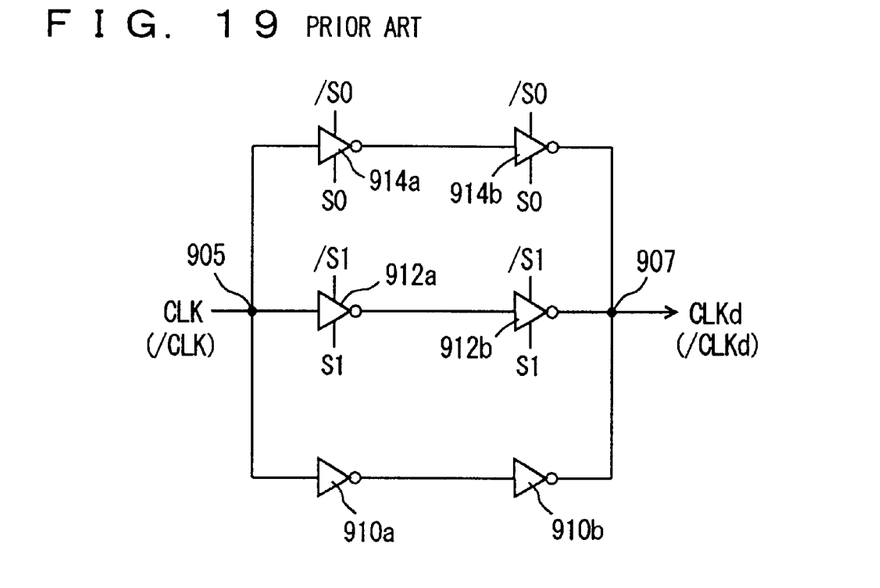
FIG. 19 schematically shows, by way of example, a structure of a conventional slew rate adjusting circuit.

FIG. 19 shows, by way of example, the structure of a conventional slew rate adjusting circuit. In FIG. 19, the slew rate adjusting circuit includes: inverter circuits 910a and 910b that are connected in series between an input node 905 and an output node 907; tristate inverter buffers 912a and 912b which are connected in series between input node 905 and output node 907, and are selectively activated in accordance with slew rate adjusting data S1 and /S1; and tristate inverter buffers 914a and 914b which are connected in series between input and output nodes 905 and 907, and are selectively activated in accordance with slew rate adjusting data S0 and /S0.

Tristate inverter buffers 912a and 912b become inactive to be set to the output high-impedance state when slew rate adjusting data S1 is at L-level. Tristate inverter buffers 914a and 914b are set to the inactive state, and attains the output high-impedance state when slew rate adjusting data S0 is at L-level. Slew rate adjusting data S0 and /S0 are complementary to each other, and slew rate adjusting data S1 and /S1 are complementary to each other.

When slew data adjusting data S0 and S1 are both at L-level, tristate inverter buffers 912a, 912b, 914a and 914b are all in the output high-impedance state. In this state, delayed clock signal CLKd is produced by inverter buffers 910a and 910b. Therefore, the delay time of delayed clock signal CLKd with respect to clock signal CLK takes the largest value. This state corresponds to the state that the output circuit has a large output node drive capability, and the time period, for which one MOS transistor TR1 drives the output node, is increased.

When slew rate adjusting data S0 and S1 are set to H-level, all tristate inverter buffers 912a, 912b, 914a and 914b become active, and delayed clock signal CLKd is produced by these inverter buffer 910b and tristate inverter buffers 912b and 914. In this case, therefore, the size (current drive capability) of one inverter buffer equivalently increases so that the delay time of delayed clock signal CLKd with respect to clock signal CLK becomes short. Thus, the time period, for which two MOS transistors TR1 and TR2 drive the output node in the output circuit, is made long.

Thus, in the case where the current drive capability for the output node of output circuit is small, the delay time of delayed dock signal CLKd is set small, and the two MOS transistors are used for driving the output node fast.

As shown in FIG. 19, the size of the inverter buffer for producing delayed clock signal CLKd is equivalently increased in accordance with slew rate adjusting data S0 and S1, and thereby the delay time of delayed clock signal CLKd can be reduced.

The slew rate adjusting circuit shown in FIG. 19 is also provided for complementary clock signals /CLK and /CLKd.

Figure 20:
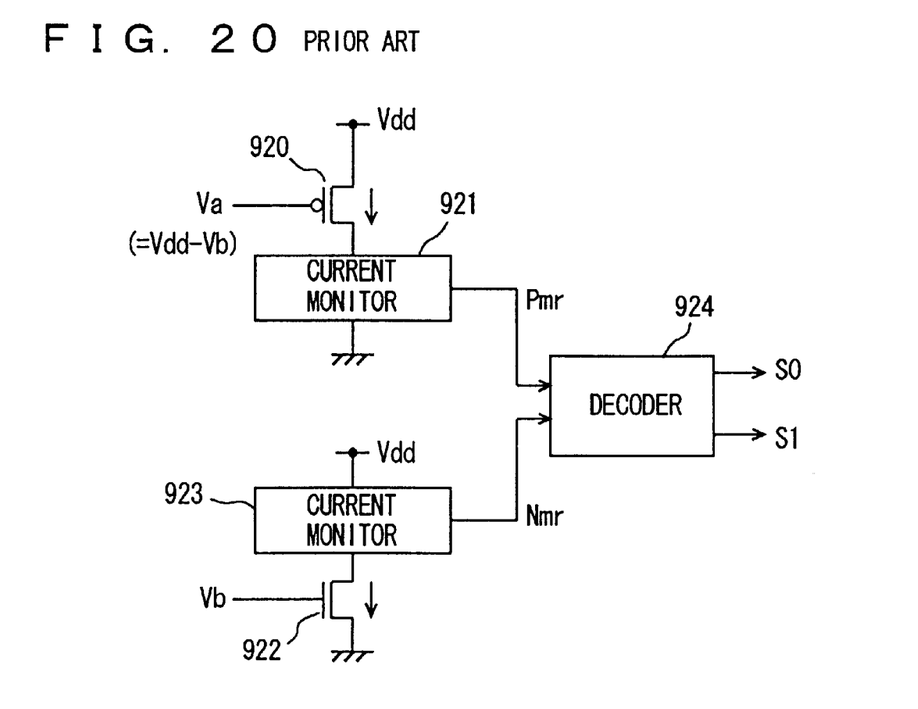
FIG. 20 schematically shows a structure of a conventional slew rate adjusting data generating circuit.

FIG. 20 schematically shows, by way of example, a structure of a circuit for generating the slew rate adjusting data S0 and S1. In FIG. 20, the slew rate adjusting data generating circuit includes: a dummy P-channel MOS transistor 920 which is coupled to the power supply node; a current monitor circuit 921 which monitors the current flowing through dummy P-channel MOS transistor 920; a dummy N-channel MOS transistor 922 coupled to the ground node; a current monitor circuit 923 which is coupled between the power supply node and dummy N-channel MOS transistor 922, and monitors the current flowing through dummy N-channel MOS transistor 922; and a decode circuit 924 which decodes output signals Pmr and Nmr of current monitor circuits 921 and 923 for producing slew rate adjusting data S0 and S1.

Dummy P-channel MOS transistor 920 receives, on its gate, a reference voltage Va, and dummy N-channel MOS transistor 922 receives, on its gate, a reference voltage Vb. Reference voltages Vb and Va are set to such values that dummy transistors 920 and 922 have the gate-source voltages equal in absolute value to each other. Thus, a relationship of Va=Vdd−Vb is satisfied.

These dummy transistors 920 and 922 are formed on the same chip with MOS transistors TR1 and TR2 included in output circuit 902, and are subject to the same variations in parameters, operation temperature and power supply voltage Vdd. as output circuit 902. The currents flowing through dummy MOS transistors 920 and 922 are monitored, and the current drive capability of the output node of output circuit 902 is detected. Current monitor circuits 921 and 923 detect the levels of the currents flowing through corresponding dummy MOS transistors 920 and 922, among discrete current levels (e.g., high, middle and low levels), and produce signals Pmr and Nmr in accordance with the result of detection.

If the current drive capability of the output node of output circuit 902 is large, the current drive capabilities of these dummy MOS transistors 920 and 922 are also large, and large currents flow through dummy MOS transistors 920 and 922, respectively. In this case, the delay time of the delayed clock signal is increased, and the time period for driving the output node by one MOS transistor is increased. Thus, the detection result data Pmr and Nmr are interrelated with the output node drive capability of the output circuit.

As described above, current monitor circuits 921 and 923 monitor the currents flowing through dummy MOS transistors 920 and 922, whereby the current drive capabilities of output driving MOS transistors TR1 and TR2 in output circuit 902 can be detected. Decoder 924 decodes detected result data Pmr and Nmr, to produce slew rate adjusting data S0 and S1.

The output node drive capability of the output circuit is monitored by utilizing the slew rate adjusting data producing circuit as shown in FIG. 20, whereby the output slew rate can be adjusted in accordance with the actual capability of this output circuit.

In the delay clock generating circuit, however, delay paths each including the same number of stages of inverter buffers are connected in parallel with each other. In accordance with slew rate adjusting data S0 and S1, each delay path is selectively activated to adjust the size (current drive capability) of the buffer circuit in the delayed clock generating circuit. Equivalently, the cascaded two inverter circuits each have sizes adjusted in accordance with the actual current drive capability of the output circuit.

However, in the case of changing the equivalent size of the inverter circuit, as for the input/output response characteristics, steep rising/falling characteristics can be implemented, but the response time does not greatly change, so that the delay time cannot be changed to a large extent (only the waveform of the delayed clock signal becomes steep or not). Therefore, it is impossible to adjust sufficiently and accurately the delay time of the delayed clock signal in accordance with the actual drive capability of the output circuit, and the delay time can be adjusted only within a narrow range due to restrictions by the response time of the inverter buffer. This results in a problem that the adjusting margin of the slew rate is small.

SUMMARY OF THE INVENTION

An object of the present invention is to provide a slew rate adjusting circuit and a semiconductor device, which allow accurate adjustment of the output slew rate.

Another object of the present invention is to provide a slew rate adjusting circuit and a semiconductor device, which allows change in slew rate over a sufficiently wide range of a delay time, without restrictions by a response time of an inverter circuit for producing a delayed clock signal.

A slew rate adjusting circuit according to the present invention includes a timing clock generating circuit for receiving a clock signal and producing an output timing signal. The timing clock generating circuit includes a variable delay circuit, having a number of delay stages variable, for delaying the clock signal.

The slew rate adjusting circuit according to the invention further includes a delay setting circuit for setting the number of the delay stages of the variable delay circuit according to slew rate adjusting data. An output circuit is activated in accordance with a timing clock signal, and drives an output node to produce external data in accordance with an internal data.

A semiconductor device according to the present invention includes: a timing clock producing circuit for receiving a clock signal and producing a first output timing signal; and an adjusted clock producing circuit for receiving the clock signal, and producing a second output timing signal delayed relative to the first output timing signal. The adjusted clock producing circuit includes a variable delay circuit having the number of delay stages variable.

The semiconductor device according to the invention further includes: a first output stage activated in accordance with the first output timing signal to drive an output node in accordance with an internal data; a second output stage being in accordance with the second output timing signal to drive the output node in accordance with the internal data; and a delay setting circuit for setting the number of delay stages of the variable delay circuit in accordance with slew rate adjusting data.

The variable delay circuit is used to produce the delayed clock signal (timing signal) for driving the output node. Thus, even in the case where the variable delay circuit is formed of inverter circuits, the delay time can be adjusted to a large extent by varying the number of delay stages independently of the input/output response characteristics of the inverter circuit. Consequently, a slew rate adjusting margin can be increased, and the output slew rate can be accurately adjusted in accordance with the actual output node drive capability of the output circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
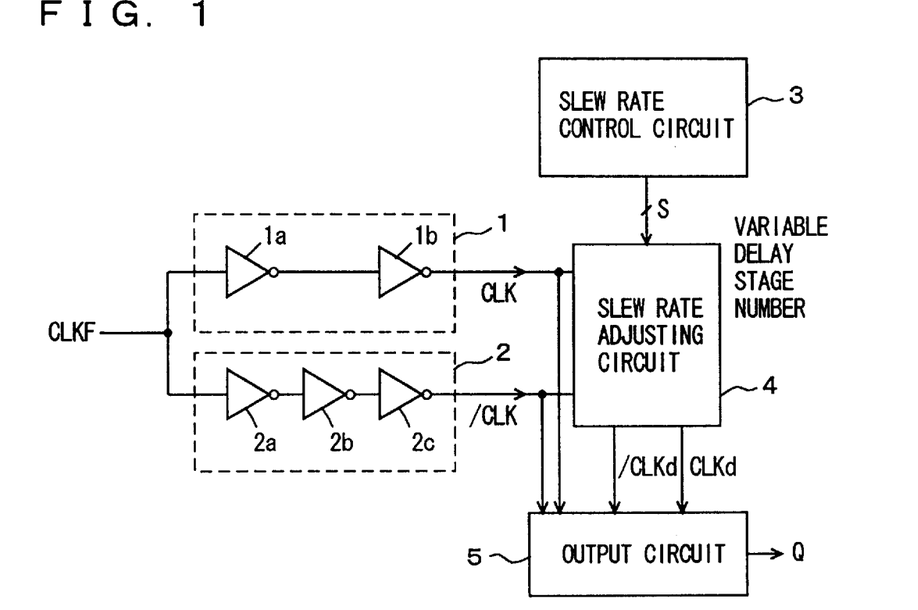
FIG. 1 schematically shows a structure of a main portion of a semiconductor device according to the invention.

FIG. 1 schematically shows a structure of an output clock generating portion according to the invention. In FIG. 1, the output clock generating portion includes: a buffer circuit 1 which buffers a clock signal CLKF to produce an internal clock signal CLK; an inverter buffer circuit 2 which buffers clock signal CLKF to produce a complementary internal clock signal /CLK; a slew rate control circuit 3 for producing slew rate adjusting data S; and a slew rate adjusting circuit 4 which produces delayed internal clock signals (output timing signals) CLKd and /CLKd in accordance with slew rate adjusting data S received from slew rate control circuit 3, and applies them to an output circuit 5. Output circuit 5 is also supplied with internal clock signals CLK and /CLK.

Figure 2:
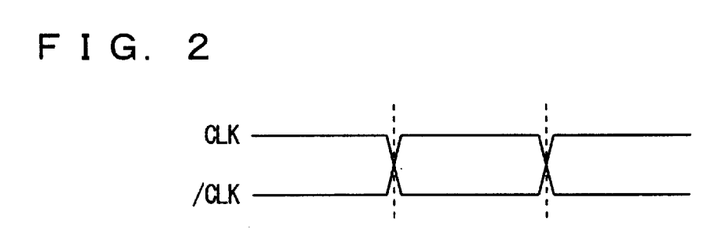
FIG. 2 schematically shows a phase relationship between complementary internal clock signals shown in FIG. 1.

Buffer circuit 1 includes cascaded two inverter circuits 1a and 1b, and inverter buffer circuit 2 includes cascaded inverter circuits 2a, 2b and 2c. The size, or the transistor size, or a ratio of the channel width to the channel length, or a current drive capability of each of inverter circuits 1a and 1b included in buffer circuit 1, is adjusted such that buffer circuit 1 and inverter buffer circuit 2 have the equal delay time. More specifically, internal clock signals CLK and /CLK are complementary clock signals having transition points synchronized with each other, as shown in FIG. 2. Clock signal CLKF may be an externally applied clock signal, or may be a buffered clock signal. Clock signal CLKF is merely required to be a basic clock signal defining the operation timing of this semiconductor memory device.

Slew rate control circuit 3 has a structure shown in FIG. 20. Slew rate control circuit 3 monitors manufacturing process conditions of the output circuit of this semiconductor memory device as well as operation power supply voltage conditions and operation temperature conditions, and produces slew rate adjusting data S (multiple bits) in accordance with the results of the monitoring.

Output circuit 5 has a structure similar to that shown in FIG. 17. Output circuit 5 transfers internal read data read from an internal memory circuit (not shown), in accordance with clock signals CLK, /CLK, CLKd and /CLKd, and produces output data Q.

Slew rata adjusting circuit 4, of which structure will be described later, includes a plurality of delay trains each including cascaded inverter circuits of a different number from others. The number of delay stages in each delay train is set in accordance with slew rate adjusting data S applied from slew rate control circuit 3. Therefore, even in the case where the response time of the inverter circuits forming the delay trains depends on the factors such as manufacturing conditions, the delay time can be changed to a large extent beyond a range restricted by the response time, and the slew rate adjustable range can be increased.

Figure 3:
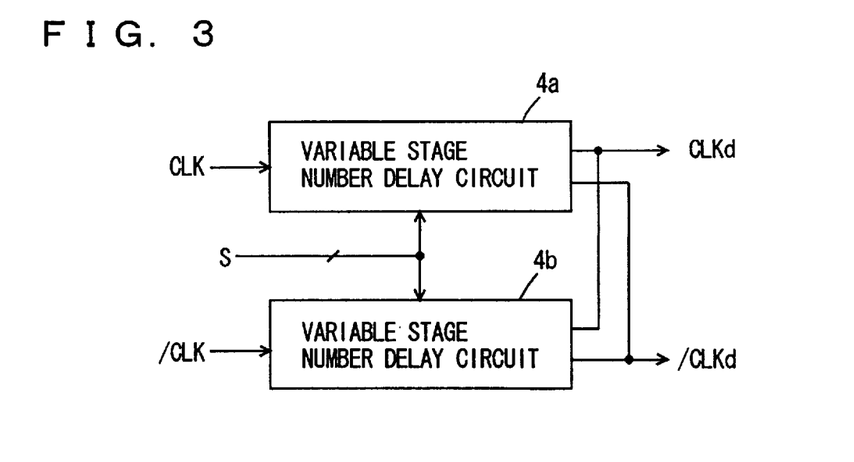
FIG. 3 schematically shows a structure of a slew rate adjusting circuit shown in FIG. 1.

FIG. 3 schematically shows a structure of slew rate adjusting circuit 4 shown in FIG. 1. In FIG. 3, slew rate adjusting circuit 4 includes: a variable stage number delay circuit 4a which has the number of the delay stages variable and delays internal clock signal CLK to produce one of output timing clock signals CLKd and /CLKd; and a variable stage number delay circuit 4b which delays complementary internal clock signal /CLK to produce the other of output timing clock signals (delayed clock signals) CLKd and /CLKd.

Each of variable stage number delay circuits 4a and 4b includes a plurality of cascaded delay stages, and the number of the delay stages is set in accordance with slew rate adjusting data S generated from slew rate control circuit 3 shown in FIG. 1. The delay times of output timing clock signals (delayed clock signals) CLKd and /CLKd are varied in steps of the delay time of the delay stage in variable stage number delay circuits 4a and 4b. Thereby, the delay time can be changed to a large extent beyond the delay time range that is restricted by the response time of the equivalent inverter circuit, as compared with the case of increasing the equivalent sizes of the delay inverters. Therefore, the slew rate can be adjusted accurately.

Figure 4:
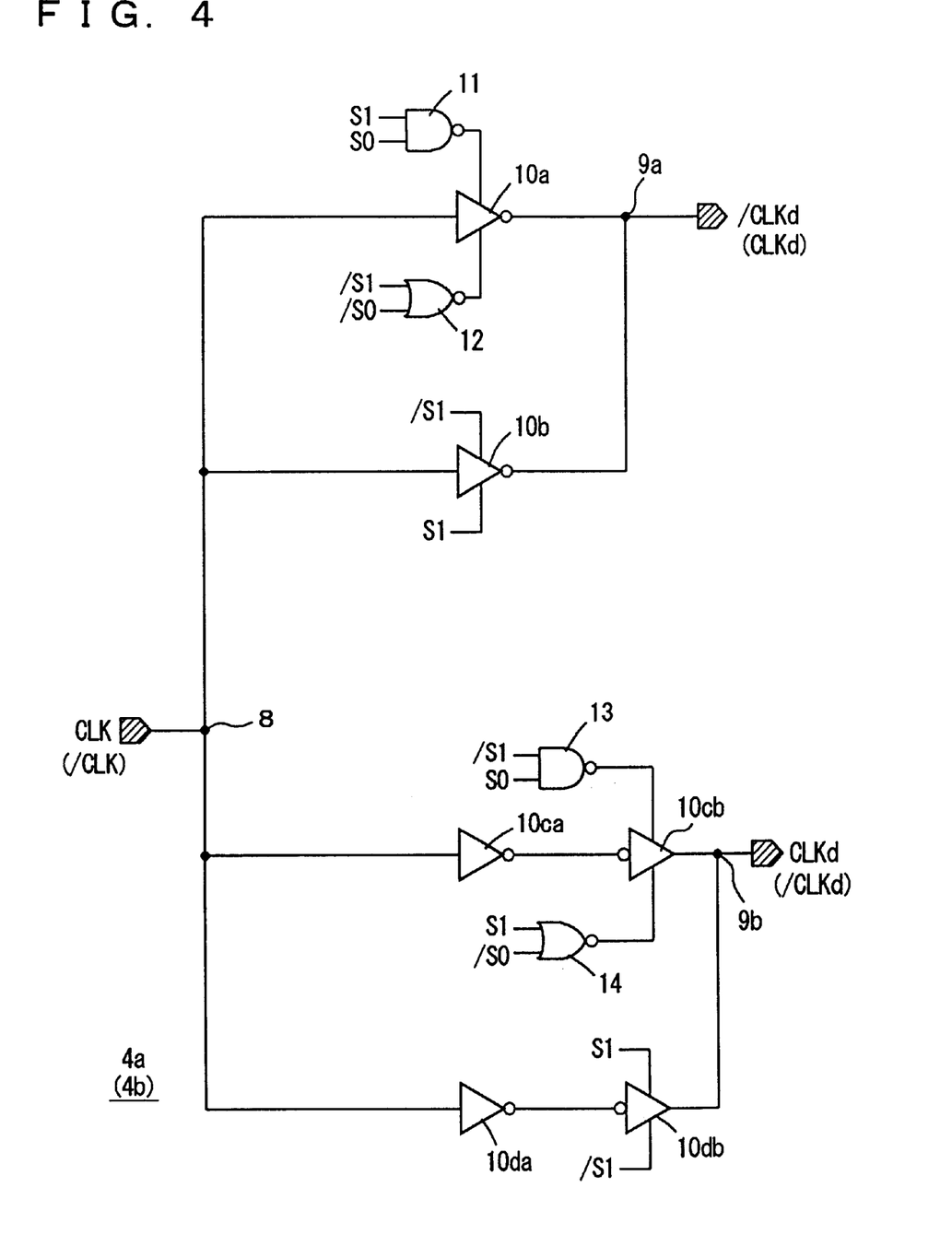
FIG. 4 shows, by way of example, a structure of the slew rate adjusting circuit according to a first embodiment of the invention.

FIG. 4 shows, by way of example, a structure of delay circuit 4a (4b) of the variable delay stage number type shown in FIG. 3. Variable stage number delay circuits 4a and 4b have the same structure, and FIG. 4 shows the structure of variable stage number delay circuit 4a. Further, numerals or characters within the parentheses in FIG. 4 indicate corresponding or related portions of delay circuit 4b.

In FIG. 4, delay circuit 4a of the variable delay stage number type includes: a tristate inverter buffer 10a which inverts and transmits internal clock signal CLK to output node 9a when made active; and a tristate inverter buffer 10b which is connected in parallel to tristate inverter buffer 10a, and inverts internal clock signal CLK for transmission to output node 9a when made active.

For controlling activation and deactivation of tristate inverter buffer 10a, there are provided, in FIG. 4, an NAND circuit 11 for receiving slew rate adjusting data S1 and S0, and an NOR gate 12 for receiving slew rate adjusting data /S0 and /S1. When the output signal of NAND gate 11 is at L-level and the output signal of NOR gate 12a is at H-level, tristate inverter buffer 10a is activated to invert internal clock signal CLK for producing complementary delayed clock signal (output timing signal) /CLKd. More specifically, tristate inverter buffer 10a, when the output signal of NAND gate 11 is at L-level, a charging P-channel MOS transistor included in tristate inverter buffer 10a is coupled between a power supply node and an output node. When the output signal of NOR circuit 12 is at H-level, a discharging N-channel MOS transistor included in tristate inverter buffer 10a is coupled between the output node and the ground node. Therefore, tristate inverter buffer 10a is activated when both slew rate adjusting data S0 and S1 are at H-level.

Tristate inverter buffer 10b is activated when slew rate adjusting data S1 and complementary slew rate adjusting data /S1 are at H- and L-levels, respectively. Slew rate adjusting data S0 and /S0 are complementary to each other, and slew rate adjusting data S1 and /S1 are complementary to each other.

Tristate inverter buffers 10a and 10b form a delay train of one delay stage. The size of the equivalent inverter buffer of this delay stage of one stage and thus the current drive capability thereof are adjusted by selectively activating inverter buffers 10a and 10b.

Delay circuit 4a of the variable delay stage number type further includes: an inverter circuit 10ca which inverts internal clock signal CLK; a tristate inverter buffer 10cb which inverts the output signal of inverter circuit 10ca and transmits it to output node 9b when made active; an inverter 10da which inverts internal clock signal CLK; and a tristate inverter buffer 10db which inverts the output signal of inverter 10da for transmission to output node 9b when made active. A delay circuit of inverter circuit 10ca and inverter buffer 10cb is connected in parallel to a delay circuit of inverter 10da and tristate inverter buffer 10db. In the delay trains of two delay stages, these delay circuits are selectively activated so that the current drive capability of the delay train is adjusted (i.e., the equivalent size of the inverter buffer is adjusted) so that the slew rate is finely adjusted.

For activating selectively the delay trains of two delay stages, there are provided an NAND gate 13 receiving slew rate adjusting data S0 and /S1, and an NOR gate 14 receiving slew rate adjusting data /S0 and S1. Tristate inverter buffer 10cb is activated to delay and invert the output signal of inverter 10ca when the output signal of NAND gate 13 is at L-level, and the output signal of NOR gate 14 is at H-level.

Tristate inverter buffer 10db is activated to drive output node 9b in accordance with the output signal of inverter 10da when slew rate adjusting data S1 and complementary slew rate adjusting data /S1 are at L- and H-levels, respectively.

The delay stage formed of one inverter is arranged between input node 8 and output node 9a. Also, the delay stage formed of two inverters is arranged between input node 8 and output node 9b. In accordance with slew rate adjusting data S0 and S1, the number of delay stage(s) disposed between input node 8 and output node 9a or 9b is changed to adjust the delay time of delayed clock signal CLKd and /CLKd.

The corresponding output nodes of the delay trains of the delay circuits 4a and 4b are wired. If the delay train formed of one inverter is selected in variable stage number delay circuit 4a, inverted delayed clock signal (output timing signal) /CLKd is produced. In this case, variable stage number delay circuit 4b produces delayed clock signal CLKd. If the delay train of two inverter stages is selected in delay circuit 4a to produce delayed clock signal CLKd, delay circuit 4b produces complementary delayed clock signal /CLKd. Therefore, by interconnecting the corresponding output nodes of delay circuits 4a and 4b, delayed clock signals CLK and /CLK can always be produced regardless of the number of delay stage(s) in the delay trains. Now, description will be given on the operation of the delay circuit 4a shown in FIG. 4. In the following description on an operation, the logical level "1" corresponds to H-level, and logical level "0" corresponds to L-level.

(i) S1=S0=0:

In this state, the output signal of NAND circuit 11 is at H-level, and the output signal of NOR gate 12 is at L-level. Tristate inverter buffer 10a is inactive, and attains the output high-impedance state. Likewise, tristate inverter buffer 10b is in the output high-impedance state. Further, the output signal of NAND circuit 13 is at H-level, and the output signal of NOR circuit 14 is at L-level. Tristate inverter buffer 10cb is inactive and in the output high-impedance state. Tristate inverter buffer 10db is activated to invert the output signal of inverter 10da for transmission to output node 9b.

In the state of S1=S0=0, therefore, internal clock signal CLK is transmitted via the delay train formed of inverters 10da and 10db, and delayed dock signal CLKd is produced. Thus, the conditions of S1=S0=0 correspond to the state, in which the delayed clock signal CLKd has the largest delay time.

(ii) S1=0 and S0=1

In this state, slew rate adjusting data S1 is "0" and at L-level. The output signal of NAND gate 11 is at H-level, the output signal of NOR gate 12 is at L-level, and tristate inverter buffer 10a is in the output high-impedance state. Likewise, tristate inverter buffer 10b is in the output high-impedance state because slew rate adjusting data S1 is at L-level ("0").

The output signal of NAND gate 13 attains L-level, and the output signal of NOR gate 14 attains H-level, and responsively tristate inverter buffer 10cb is activated to invert the output signal of inverter 10ca for transmission to output node 9b. Since tristate inverter buffer 10db is active, output node 9b is driven by two tristate inverter buffers 10cb and 10db. In this case, therefore, the size of inverter circuit driving delayed clock signal CLKd equivalently increases, and the delay time thereof becomes shorter than the delay time provided by the delay train formed of two inverter circuits 10da and 10db.

(iii) S1=1 and S0=0:

In this state, tristate inverter buffer 10db attains the output high-impedance state. The output signal of NAND circuit 13 attains H-level, the output signal of NOR circuit 14 attains L-level, and tristate inverter buffer 10cb attains the output high-impedance state. The output signal of NAND circuit 11 is at H-level, the output signal of NOR gate 12 is at L-level, and tristate inverter buffer 10a is in the output high-impedance state. Since slew rate adjusting data S1 is at H-level ("1"), tristate inverter buffer 10b is activated to invert the internal clock signal CLK applied to input node 8 for transmission to output node 9a.

In this case, therefore, complementary delayed clock signal /CLKd is produced via one tristate inverter buffer 10b. In this operation, the number of delay stages is likewise changed in the delay circuit 4b of the variable delay stage number type, and delayed clock signal CLKd is produced from complementary internal clock signal /CLK via one inverter. In this state, therefore, delayed clock signals CLKd and /CLKd are produced with a delay time of one inverter stage, and the delay time of the delayed clock signal can be shorter, by the delay time of one inverter stage, than that provided by the foregoing two inverters. This delay time by the one inverter sufficiently exceeds the range, in which the delay time may change through changing of the rising time and falling time according to the input/output response characteristics of the inverter circuit, as will be described later.

(iv) S1=S0=1:

In this state, tristate inverter buffer 10db is in the output high-impedance state. The output signal of NAND gate 13 is at H-level, the output signal of NOR gate 14 is at L-level, and tristate inverter buffer 10cb is in the output high-impedance state.

The output signal of NAND gate 11 is at L-level, the output signal of NOR gate 12 is at H-level, and tristate inverter buffer 10a is activated to invert internal clock signal CLK applied to input node 8 for transmission to output node 9a. Tristate inverter buffer 10b is in the active state. Therefore, output node 9a is driven by two tristate inverter buffers 10a and 10b so that the delay time of delayed clock signal /CLKd is shorter than that that in the case where one tristate inverter buffer 10b operates.

The delay circuits 4a and 4b have the same structure. Therefore, delayed clock signals CLKd and /CLKd having the same delay time can be produced in accordance with slew rate adjusting data S0 and S1.

Slew rate adjusting data S1 sets the number of delay stages in variable stage number delay circuit 4a (4b), and slew rate adjusting data S0 sets the size (the number of the delay trains connected in parallel) of the tristate inverter buffer formed of the delay train of thus set delay number. Accordingly, the delay time for delayed clock signals CLKd and /CLKd can be adjusted in a step of the delay time of one tristate inverter buffer, and subsequently the delay time is finely adjusted by adjusting the size of the tristate inverter buffer.

Figure 5:
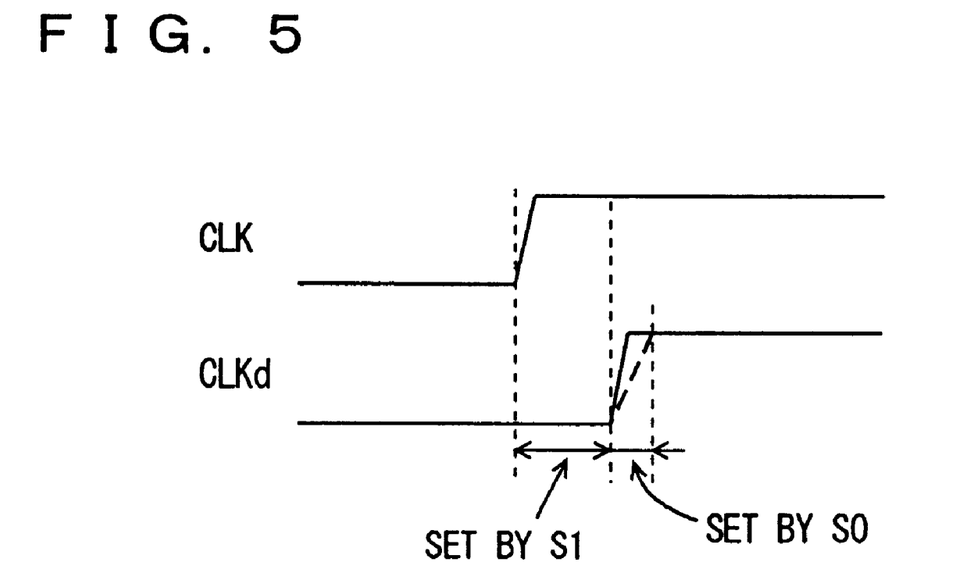
FIG. 5 is a signal waveform diagram representing an operation of the slew rate adjusting circuit shown in FIG. 4.

FIG. 5 schematically illustrates an adjusting operation of the slew rate adjusting circuit according to the first embodiment of the invention. The delay time of delayed clock signal CLKd with respect to internal clock signal CLK is set in a step of a value corresponding to the delay stage (selected inverter delay) based on slew rate adjusting data S1. Accordingly, the delay time of delayed clock signal CLKd with respect to internal clock signal CLK can be changed to a large extent without restriction by the response time of the inverter circuit.

According to slew rate adjusting data S0, the size of the inverter in the selected delay train is equivalently changed, and the rising/falling time (response time) thereof is changed. Thereby, the delay time can be finely adjusted in accordance with the response characteristics, and the output slew rate can be set to the optimum value in accordance with the actual current drive capability of the output circuit.

In the case of changing the response characteristics, the change start timing of the output signal does not varied, and only the changing rate or speed of the output signal changes so that the variable range of the delay time is smaller than that in the case where the change start timing of the output signal is varied by varying the number of delay stages.

In the foregoing structure shown in FIG. 4, the variable numbers of delay stages in delay circuits 4a and 4b are 1 and 2. However, these variable numbers of delay stages can be further expanded by increasing the number of bits of the slew rate adjusting data. In the selected delay train, the size is set to one or two times large. However, the equivalent size of the inverter circuit can be arbitrarily set to a value such as one, two, three or four times the basic size. This can be easily achieved merely by increasing the number of bits of slew rate adjusting data S0, and increasing the number of delay circuits arranged in parallel in each delay train. By selectively activating the tristate inverter buffer in the output stage, the equivalent size is adjusted.

According to the first embodiment of the present invention, as described above, the output slew rate adjusting circuit is configured to allow change in number of delay stages of the delay circuit producing the delayed clock signal. Therefore, the delay time of the delayed clock signal (output timing signal) determining the data output timing can be changed in a step of the unit delay stage, and the delay time can be changed to a large extent without restrictions by the response characteristics of the delaying inverter so that the adjustment margin for the output slew rate can be increased.

Thus, the structure, in which slew rate adjusting data S0 equivalently increases the size of the delay inverter, corresponds to the conventional structure. In this case, if the output load of, e.g., the inverter buffer is small, and the inverter buffer has sufficiently fast input/output characteristics, it is impossible to change the delay time to a large extent even by the change in size of the inverter buffer. However, even in such case, the delay time can be adjusted in a step of the delay time of one inverter buffer by changing the number of delay stages without an influence by the input/output response characteristics.

[Second Embodiment]

Figure 6:
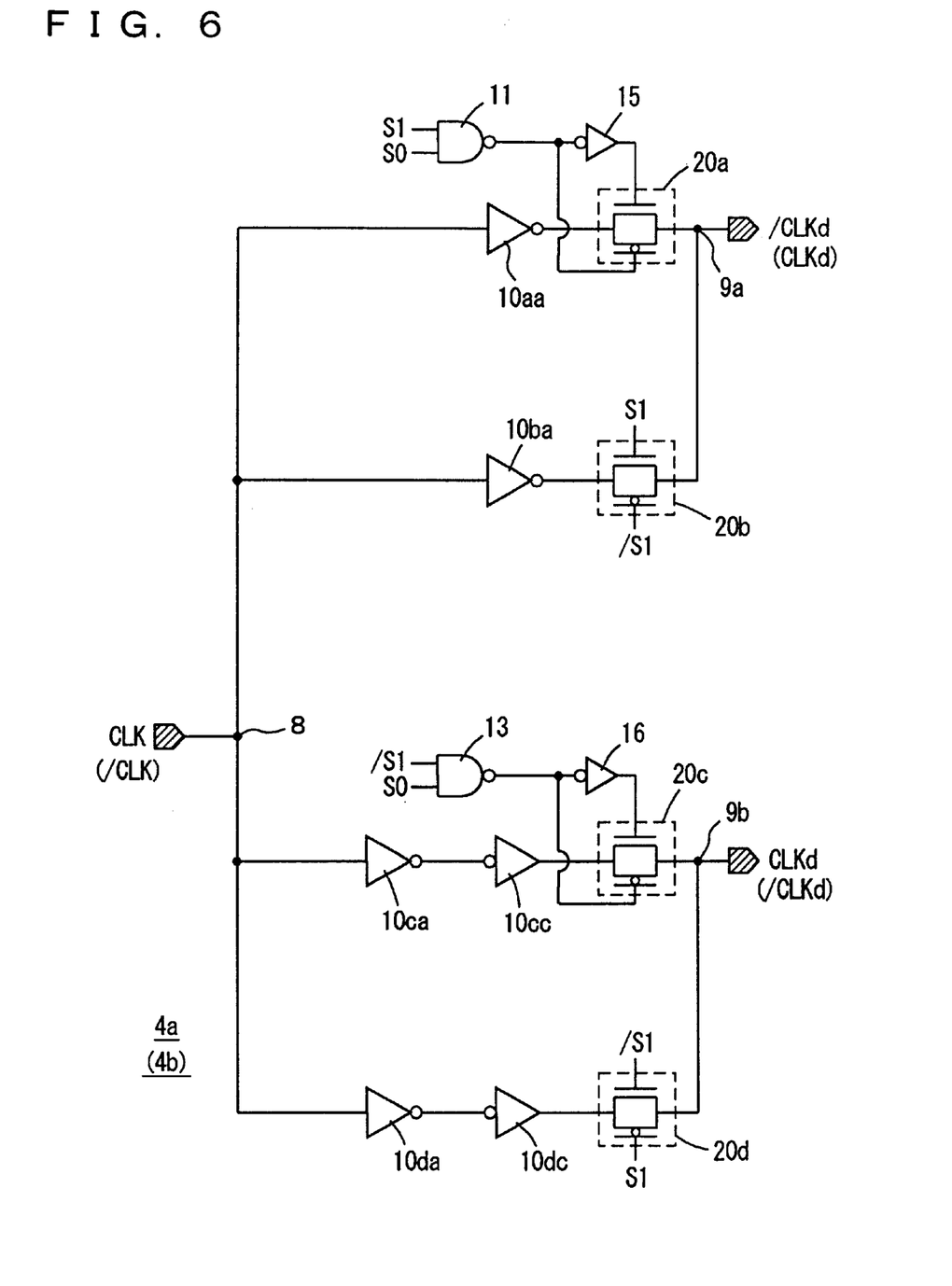
FIG. 6 schematically shows a structure of a slew rate adjusting circuit according to a second embodiment of the invention.

FIG. 6 shows, by way of example, a structure of slew rate adjusting circuit 4a (4b) according to a second embodiment of the invention. FIG. 6 shows a structure of the variable stage number delay circuit 4a for delaying internal clock signal CLK, and numerals or characters within the parentheses indicate input/output signals of variable stage number delay circuit 4b for delaying complementary internal clock signal /CLK.

In FIG. 6, variable stage number delay circuit 4a includes inverters 10aa and 10ba each inverting internal clock signal CLK applied to input node 8, and CMOS transmission gates 20a and 20b for transmitting the output signals of inverters 10aa and 10ba to output node 9a when rendered conductive, respectively.

For controlling on/off of CMOS transmission gate 20a, there are provided an NAND gate 11 for receiving slew rate adjusting data S0 and S1, and an inverter 15 for inverting the output signal of NAND gate 11. This CMOS transmission gate 20a is rendered conductive when slew rate adjusting data S0 and S1 are both at H-level, and the output signal of NAND gate 11 is at L-level. CMOS transmission gate 20b is rendered conductive when slew rate adjusting data S1 is at H-level, and complementary slew rate adjusting data /S1 is at L-level.

Delay circuit 4a further includes: delay inverter buffers 10ca and 10cc forming a delay train for delaying internal clock signal CLK applied to input node 8; cascaded delay inverter buffers 10da and 10dc forming a delay train for delaying internal clock signal CLK applied to input node 8; a CMOS transmission gate 20c for transmitting the output signal of inverter buffer 10cc to output node 9b when rendered conductive; and a CMOS transmission gate 20d for transmitting the output signal of delay inverter buffer 10dc to output node 9b when rendered conductive.

For controlling on/off of CMOS transmission gate 20c, there are provided an NAND gate 13 for receiving slew rate adjusting data S0 and S1, and an inverter 16 for inverting the output signal of NAND gate 13. CMOS transmission gate 20c is rendered conductive when the output signal of NAND gate 13 is at L-level.

CMOS transmission gate 20d is rendered conductive when slew rate adjusting data S1 is at L-level.

In the variable stage number delay circuit 4a shown in FIG. 6, when slew rate adjusting data S1 is at H-level, CMOS transmission gate 20d is kept off. Since the output signal of NAND gate 13 is at H-level (slew rate adjusting data /S1 is at L-level), CMOS transmission gate 20c is likewise kept off. In this state, the variable stage number delay circuit 4d produces delayed clock signal CLKd.

CMOS transmission gate 20b is rendered conductive to transmit the output signal of delay inverter buffer 10ba to output node 9a. Thus, delayed clock signal /CLKd is produced via the one delay inverter buffer. In this state, when slew rate adjusting data S0 is at H-level, the output signal of NAND gate 11 attains L-level so that CMOS transmission gate 20a is rendered conductive, and the output signal of delayed inverter buffer 10aa is likewise transmitted to output node 9a. In this state, therefore, the size of the delay inverter buffer producing delayed clock signal /CLKd is equivalently increased, and the delay time of clock signal /CLKd is reduced.

When slew rate adjusting data S0 is at L-level, CMOS transmission gate 20a is kept off, and delayed clock signal /CLKd is produced using only delay inverter buffer 10ba.

When slew rate adjusting data S1 is at L-level, CMOS transmission gate 20d is rendered conductive. When slew rate adjusting data S0 is at H-level, CMOS transmission gate 20c is rendered conductive. In this case, therefore, delayed clock signal CLKd is produced via two stages of delay inverter buffers 10da and 10dc and inverter buffers 10ca and 10cc.

The structure of the delay circuit 4a shown in FIG. 6 is equivalent to the structure of the first embodiment except for that the tristate inverter buffer is replaced with a set of one inverter circuit and a CMOS transmission gate. In the second embodiment, therefore, the delay time of delayed clock signals CLKd and /CLKd can be changed in a step of a delay time of one delay inverter buffer, and can be finely adjusted in accordance with the size of the delay inverter buffer, as can also be done in the first embodiment.

In this second embodiment, the number of delay stages producing the delayed clock signal is not restricted to one or two, and the delay train having more than two delay stages may be employed. In the delay train having the same number of delay stages, the delay inverter buffers have the same size, and the delay circuits (sets of the inverter circuits of the same number of delay stages), which are arranged in parallel in the respective delay trains, are set to have the same delay time.

According to the second embodiment of the invention, as described above, the transmission gate is arranged at the output stage of each delay train, and the delay train is selected in accordance with on/off of the transmission gate for adjusting the delay time in a step of a delay of one delay stage of the delay train. Accordingly, the output portion of each delay train can be reliably set to the output high-impedance state, and the output slew rate can be accurately determined.

[Modifications of Circuit]
[First Modification]

Figure 7:
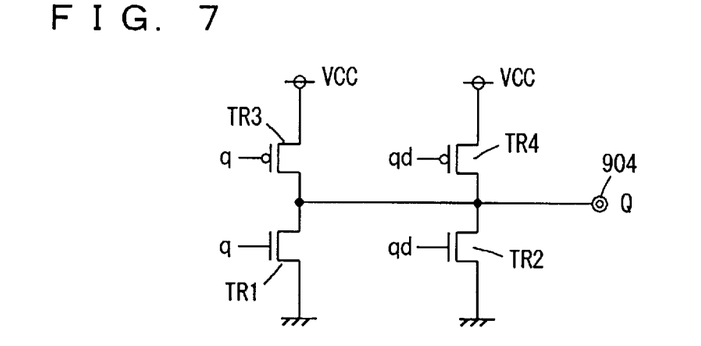
FIG. 7 shows, by way of example, a structure of a first modification of an output circuit of the semiconductor device according to the invention.

FIG. 7 schematically shows a structure of a first modification of the output circuit. In FIG. 7, p-channel MOS transistors TR3 and TR4 are arranged in parallel between the power supply node and an output node 904. MOS transistors TR3 and TR4 receive internal read (drive) signals q and qd on their gates, respectively. N-channel MOS transistors TR1 and TR2, receiving internal read (drive) signals q and qd on their respective gates, are arranged in parallel between output node 904 and the ground node.

In the structure of the output circuit shown in FIG. 7, output node 904 is driven to H- or L-level in accordance with the internal read data. In driving output node 904 to L-level (ground voltage level), MOS transistors TR1 and TR2 are successively rendered conductive. In driving output node 904 to H-level, MOS transistors TR3 and TR4 are successively rendered conductive. Even in the case where the output circuit has both the pull-up function and the pull-down function, both the overshoot and undershoot of output node 904 can be suppressed by driving output node 904 in two stages, and the data at either the H- or L-level can be stabilized fast.

[Second Modification]

Figure 8:
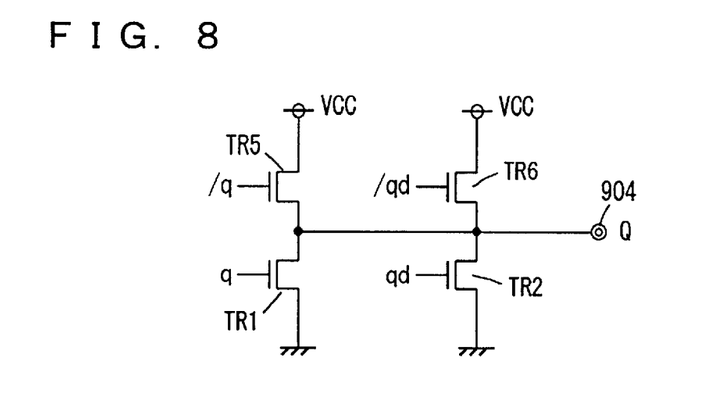
FIG. 8 schematically shows a second modification of the output circuit of the semiconductor device according to the invention.

FIG. 8 shows a structure of a second modification of the output circuit. In FIG. 8, N-channel MOS transistors TR5 and TR6 are arranged in parallel between output node 904 and the power supply node. MOS transistors TR5 and TR6 are supplied on their gates with inverted (complementary) internal read signals (drive signals) /q and /qd, respectively. N-channel MOS transistors TR1 and TR2, receiving internal read signals q and qd on their respective gates, are arranged in parallel between output node 904 and the ground node.

This output circuit shown in FIG. 8 uses only the N-channel MOS transistors, and can suppress the latch-up phenomenon. In the structure shown in FIG. 8, complementary read data IQ and /IQ are produced from internal read data IQ, and internal read signals (drive signals) qd and /qd are produced in accordance with internal clock signal CLK and delayed clock signal /CLKd. For the structure of the output circuit described at above, it is possible to employ the structure of the foregoing first or second embodiment as the structure of the delay circuit of the variable delay stage number type.

In the structure shown in FIG. 8, the output slew rate is adjusted to drive output node 904 in two stages, to suppress the occurrence of ringing, so that the H- and L-level data can be stably output, and fast data transfer can be achieved.

[Third Modification]

Figure 9:
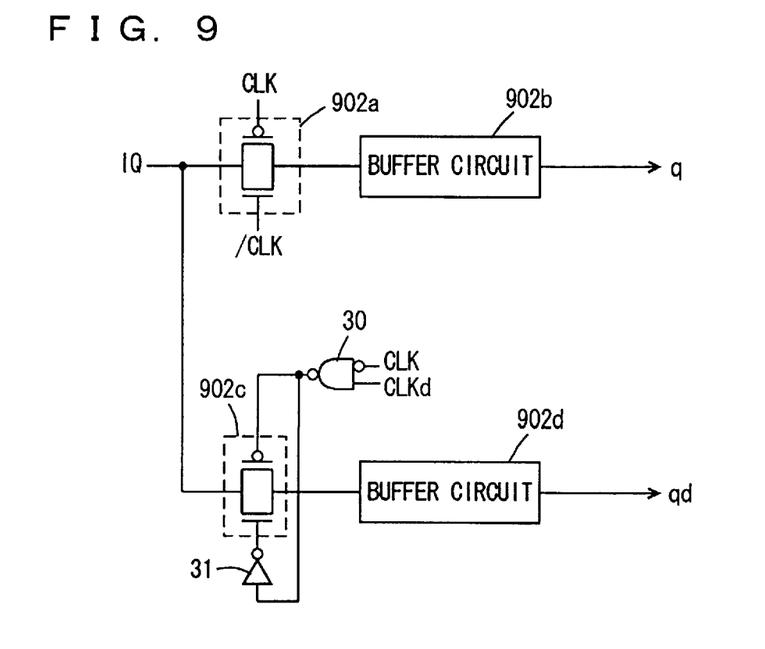
FIG. 9 shows a structure of an internal,read signal (drive signal) generating portion of the semiconductor device according to the invention.

FIG. 9 schematically shows a structure of a third modification of the output circuit according to the invention. In FIG. 9, a buffer circuit 902b producing internal read signal (drive signal) q is supplied with internal read data IQ via CMOS transmission gate 902a, and a buffer circuit 902d producing internal read signal (drive signal) qd is supplied with internal read data IQ via CMOS transmission gate 902c.

CMOS transmission gate 902a is rendered conductive when internal clock signal CLK and complementary internal clock signal /CLK are at L- and H-levels, respectively. CMOS transmission gate 902c is supplied with an output signal of a gate circuit 30 receiving internal clock signal CLK and delayed clock signal CLKd, and an output signal of an inverter 31 receiving the output signal of gate circuit 30.

CMOS transmission gate 902c is rendered conductive when the output signal of gate circuit 30 is at L-level. Gate circuit 30 outputs a signal at L-level when internal clock signals CLK and delayed clock signal CLKd are at L- and H-levels, respectively.

Therefore, CMOS transmission gate 902c is rendered non-conductive when delayed clock signal CLKd attains at L-level subsequently to the turn-on of CMOS transmission gates 902a in response to the falling of internal dock signal CLK. Thus, the output node is driven in accordance with internal read signal (drive signal) q when the delay time of delayed clock signal CLKd elapses after the output node is rapidly driven in accordance with internal read signals (drive signals) q and qd. Even in this case, the output node is driven in two stages, so that the ringing of the output node can be accurately suppressed by adjusting the output slew rate in accordance with the capability of the output circuit, similarly to the first and second embodiments.

[Fourth Modification]

Figure 10:
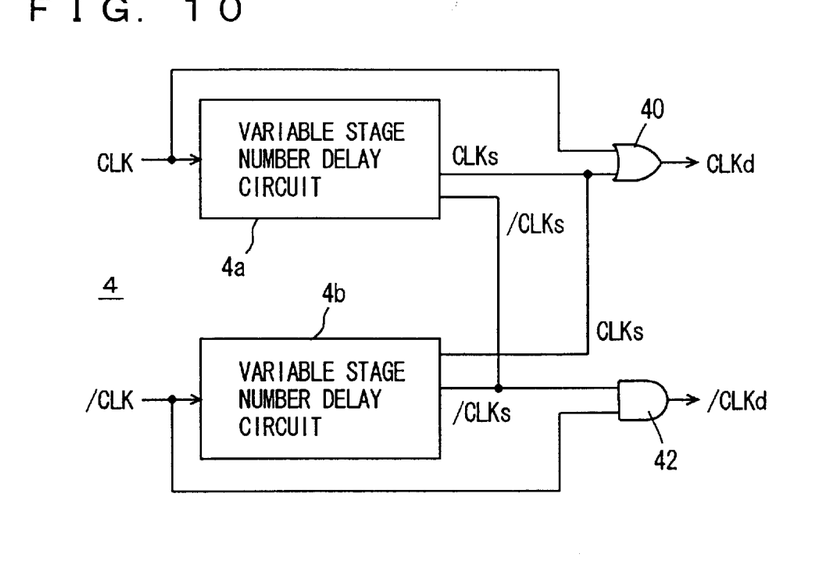
FIG. 10 schematically shows a structure of a first modification of the slew rate adjusting circuit according to the invention.

FIG. 10 schematically shows a modification of slew rate adjusting circuit 4. The slew rate adjusting circuit 4 shown in FIG. 10 includes: variable delay stage number delay circuit 4a with the number of delay stages variable for delaying internal clock signal CLK; variable delay stage number delay circuit 4b for delaying complementary internal clock signal /CLK; an OR circuit 40 receiving a delayed clock signal CLKs and internal clock signal CLK applied from delay circuit 4a or 4b, to produce delayed clock signal (output timing signal) CLKd; and AND circuit 42 receiving complementary delayed clock signal /CLKs and complementary internal clock signals /CLK from delay circuit 4a or 4b, to produce delayed clock signal (output timing signal) /CLKd.

The delay circuits 4a and 4b have the same structure as those in the first or second embodiment, and produce delayed clock signals CLKs and /CLKs in accordance with the slew rate adjusting data. When one delay train is selectively activated in each of the delay circuits 4a and 4b, the delay circuit 4a produces delayed clock signal /CLKs, and the delay circuit 4b produces delayed clock signal CLKs. The nodes of delay circuits 4a and 4b for outputting the delayed clock signal CLKs are connected together, and the nodes of delay circuits 4a and 4b for outputting complementary delayed clock signal /CLKS are connected together.

Figure 11:
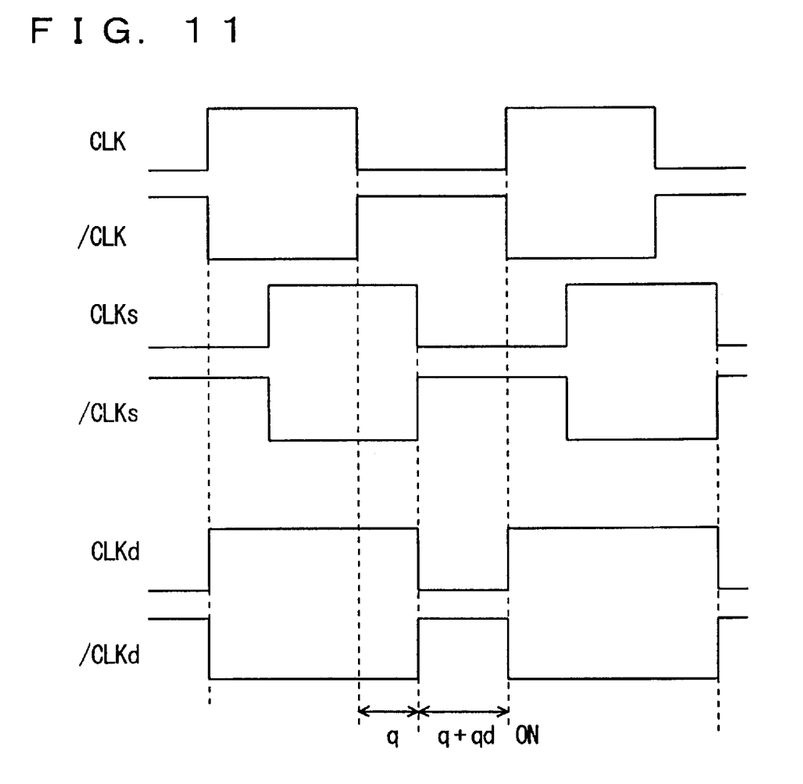
FIG. 11 is a signal waveform diagram representing an operation of the slew rate adjusting circuit shown in FIG. 10.

FIG. 11 is a signal waveform diagram representing an operation of slew rate adjusting circuit 4 shown in FIG. 10. As shown in FIG. 11, delayed clock signals CLKs and /CLKs produced by delaying internal dock signals CLK and /CLK are generated in accordance with the slew rate adjusting data (not shown) by the delay circuits 4a and 4b. OR circuit 40 produces the delayed clock signal (output timing signal) CLKd, which attains L-level after delayed clock signal CLKs falls subsequently to the falling of internal clock signal CLK. AND circuit 42 produces delayed clock signal (output timing signal) /CLK, which rises to H-level after complementary delayed clock signal /CLKs rises subsequently to the rising of complementary internal clock signal /CLK.

Thus, in the slew rate adjusting circuit 4 shown in FIG. 10, internal read signals (drive signals) q and qd are made definite, and the two transistors drive the output nodes after the delay time set by the slew rate adjusting data elapses subsequently to the driving of the output node in accordance with internal read signal (drive signal) q. By producing the one-shot pulse to drive the output node as described above, the output node can be driven in two stages, and the ringing can be suppressed.

[Fifth Modification]

Figure 12:
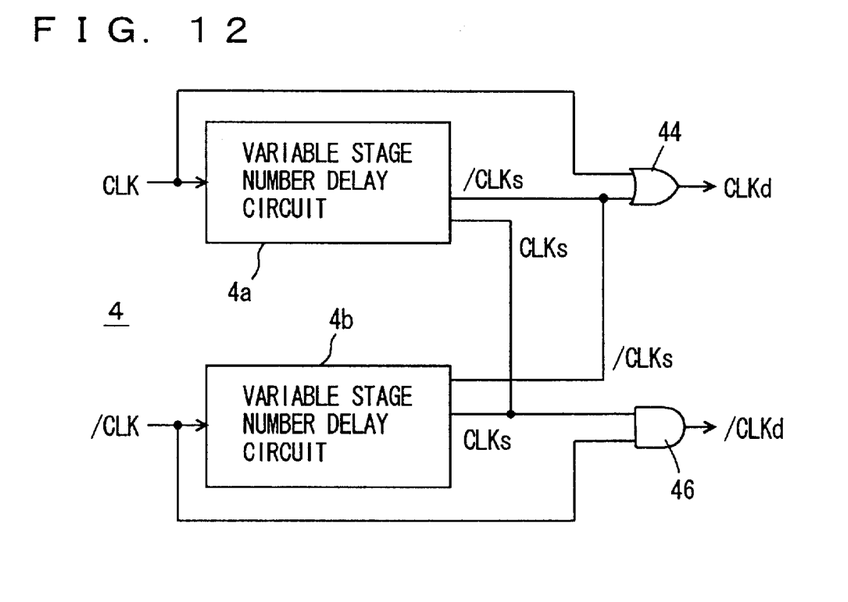
FIG. 12 schematically shows a structure of a second modification of the slew rate adjusting circuit of the semiconductor device according to the invention.

FIG. 12 schematically shows a structure of a fifth modification of the slew rate adjusting circuit according to the invention. In the structure shown in FIG. 12, an OR circuit 44 for producing delayed clock signal (output timing signal) CLKd is supplied with complementary delayed dock signal /CLKs and internal clock signal CLK from variable stage number delay circuits 4a and 4b, respectively. An AND circuit 46 for producing complementary delayed clock signal (output timing signal) /CLKd is supplied with delayed clock signal CLKs and complementary internal clock signals /CLK from delay circuits 4a and 4b, respectively.

Figure 13:
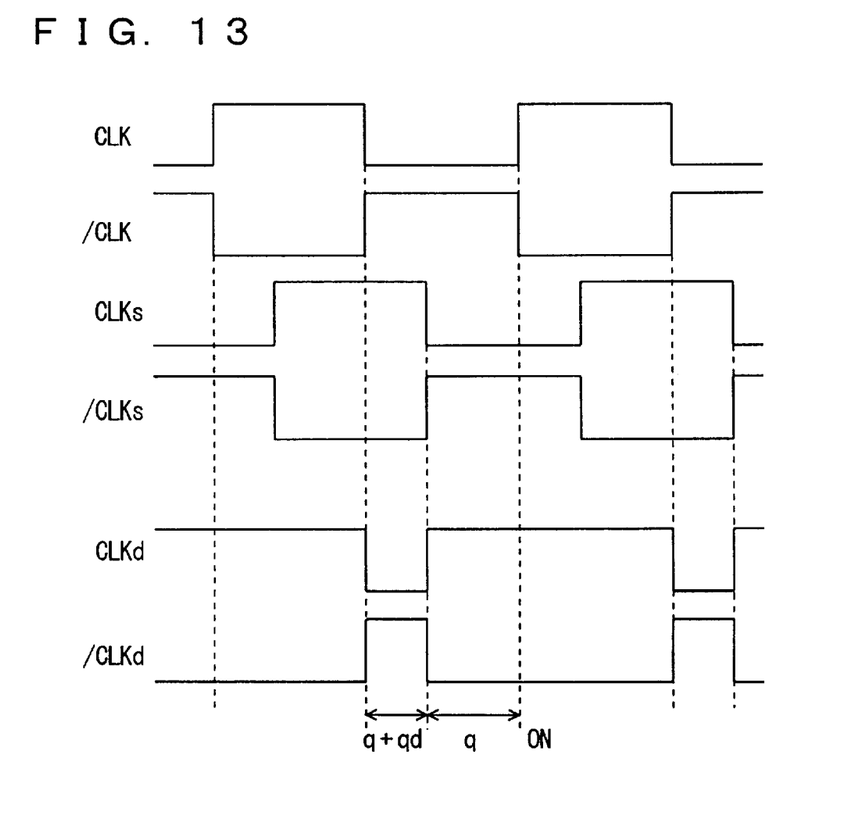
FIG. 13 is a signal waveform diagram representing an operation of the slew rate adjusting circuit shown in FIG. 12.

FIG. 13 is a signal waveform diagram representing an operation of slew rate adjusting circuit 4 shown in FIG. 12. As shown in FIG. 13, delayed clock signal CLKd generated from OR circuit 44 is kept at L-level while the delayed clock signal /CLKs is at L-level after falling of internal clock signal CLK. Thus, delayed clock signal CLKd in a one-shot pulse form is produced in response to the falling of internal clock signal CLK.

Delayed clock signal /CLKd (output timing signal) maintains H-level until delayed clock signal CLKs falls to L-level after rising of complementary internal clock signal /CLK. Thus, delayed clock signal (output timing signal) /CLKd in a one-shot pulse form is generated in response to the rising of complementary internal clock signal CLK. In response to the falling of internal clock signal CLK, therefore, the output node is driven in accordance with internal read signals (drive signals) q and dq, and is driven by one MOS transistor (e.g., TR1) in accordance with internal read signal (drive signal) q after elapsing of the delay time determined in accordance with the slew rate adjusting data. In this case, therefore, the output node is likewise driven in two stages so that occurrence of the ringing can be suppressed.

In the first and second embodiments as well as the first to fifth modifications described above, the output circuit is configured to transfer the internal read data to the output node in synchronization with the falling of internal clock signal CLK. However, it may be configured to transfer output data Q in synchronization with the rising of internal clock signal CLK. More specifically, transmission gates 902a and 902b shown in FIG. 17 may be rendered conductive in synchronization with the rising of internal clock signal CLK. In this structure, the structures shown in FIGS. 10 and 12 may be utilized, respectively, to implement a structure for rapidly driving the output node and subsequently driving the output node slowly in the data output operation, and a structure for slowly driving the output node, and subsequently driving the output node fast in the data output operation.

The description has been given on the output circuit of the clock synchronous semiconductor memory device, which performs the data output in synchronization with the clock signal. However, the present invention can be applied to a device configured to drive an output node asynchronously with the clock signal, such as a standard semiconductor memory device, in which the output node is driven in accordance with output enable signal OE. In this case, output enable signal OE is used instead of clock signal CLK for producing the output tuning signal.

Further, the present invention can be applied, not restricted to the output circuit of the clock synchronous semiconductor memory device, to output circuits of various kinds of semiconductor circuit devices, which externally output the output data in synchronization with the clock signal.

The output node may be driven in two or more stages.

In the above description, the output circuit utilizes the transmission gates that are selectively rendered conductive in response to the cock signal, for transferring the internal data to produce the internal read signal (drive signal). However, the present invention can be applied to another structure, in which a logic gate such as an NAND gate receiving the clock signal is used for producing the internal read signal (drive signal) from the internal data.

According to the invention, as described above, the structure for driving the output node in multiple stages can adjust the output slew rate in a step of a delay time of the delay inverter stage. Therefore, the adjustable width of the output slew rate can be expanded, and the adjustment margin of the output slew rate can be increased to allow accurate adjustment of the output slew rate in accordance with the capability of the output circuit, resulting in a stable output of the data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A slew rate adjusting circuit for adjusting a slew rate of an output circuit outputting external data by driving an output node in accordance with internal data when activated, comprising:

timing clock generating circuitry configured for receiving a clock signal and for producing an output timing clock signal for activating said output circuit, said timing clock generating circuitry including a variable delay circuit having a number of delay stages variable, for delaying said clock signal; and delay setting circuitry configured to produce slew rate adjusting data and to set the number of the delay stages of said variable delay circuit.

2. The slew rate adjusting circuit according to claim 1, wherein said delay setting circuitry further includes a circuit for changing a current drive capability of said variable delay circuit in accordance with said slew rate adjusting data.

3. The slew rate adjusting circuit according to claim 1, wherein said variable delay circuit includes a plurality of delay trains connected in parallel and being different in number of delay stages from each other, and said delay setting circuitry selects and activates one of said plurality of delay trains.

4. The slew rate adjusting circuit according to claim 3, wherein said delay setting circuitry further includes a circuit for changing a current drive capability of a selected delay train in accordance with said slew rate adjusting data.

5. The slew rate adjusting circuit according to claim 3, wherein each of the delay trains includes a plurality of delay circuits connected in parallel and selectively activated by said delay setting circuitry.

6. The slew rate adjusting circuit according to claim 3, wherein each of the delay trains is provided, at a output stage thereof, with a tristate inverter buffer to be selectively set to an output high-impedance state in accordance with an output signal of said delay setting circuitry.

7. The slew rate adjusting circuit according to claim 3, wherein each of the delay trains is provided, at an output stage thereof, with a switching circuit set to on and off states in accordance with an output signal of said delay setting circuitry.

8. A semiconductor device comprising:

a timing clock producing circuit for receiving a clock signal and producing a first output timing signal;

an adjusted clock producing circuit for receiving said clock signal, and configured to produce a second output timing signal delayed relative to said first output timing signal, said adjusted clock producing circuit including a variable delay circuit having a number of delay stages variable, said variable delay circuit configured to delay the clock signal;

a first output stage activated in accordance with said first output timing signal, configured to drive an output node in accordance with an internal data when activated;

a second output stage activated in accordance with said second output timing signal, configured to drive said output node in accordance with said internal data when activated; and delay setting circuitry configured to produce slew rate adjusting data and to set the number of delay stages of said variable delay circuit.

9. The semiconductor device according to claim 8, wherein said delay setting circuitry further includes a circuit for changing a current drive capability of said variable delay circuit in accordance with said slew rate adjusting data.

10. The semiconductor device according to claim 8, wherein said variable delay circuit includes a plurality of delay trains connected in parallel and different in number of delay stages from each other, and said delay setting circuitry selects and activates one of said plurality of delay trains.

11. The semiconductor device according to claim 10, wherein said delay setting circuitry further includes a circuit for changing a current drive capability of a selected delay train in accordance with said slew rate adjusting data.

12. The semiconductor device according to claim 10, wherein each of the delay trains includes a plurality of delay circuits connected in parallel, and said delay setting circuitry selectively activates said plurality of delay circuits in a selected delay train in accordance with said slew rate adjusting data.

13. The semiconductor device according to claim 10, wherein each of the delay trains is provided, at a output stage thereof, with a tristate inverter buffer selectively set to an output high-impedance state in accordance with an output signal of said delay setting circuitry.

14. The semiconductor device according to claim 10, wherein each of the delay trains is provided, at a output stage thereof, with a switching circuit set to either of on and off states in accordance with an output signal of said delay setting circuitry.

15. The semiconductor device according to claim 8, wherein said variable delay circuit has a plurality of delay trains connected in parallel, each of the delay trains having a plurality of delay circuits connected in parallel and different in number of delay stages from each other, and said delay setting circuitry selects a delay train among said plurality of delay trains, and selectively activates the delay circuits in a selected delay train in accordance with delay stage number setting data and size designating data designating a current drive capability included in said slew rate adjusting data.

* * * * *